(12) United States Patent
Kwong

(10) Patent No.: US 6,445,591 B1
(45) Date of Patent: Sep. 3, 2002

(54) MULTILAYER CIRCUIT BOARD

(75) Inventor: Herman Kwong, Kanata (CA)

(73) Assignee: Nortel Networks Limited, Quebec (CA)

( * ) Notice: Subject to any disclaimer, the term of this patent is extended or adjusted under 35 U.S.C. 154(b) by 112 days.

(21) Appl. No.: 09/636,594

(22) Filed: Aug. 10, 2000

(51) Int. Cl.[7] ................................................ H05K 7/06
(52) U.S. Cl. ...................... 361/761; 361/719; 361/764; 361/780; 361/794; 361/818; 257/686; 257/700; 257/723; 257/724; 438/109; 438/125; 29/832
(58) Field of Search ................................ 361/760–764, 361/782, 783, 792–795, 816, 818, 719, 780; 174/252, 255, 260; 257/691, 701–703, 723, 724, 686; 438/125, 109; 29/830–832, 852

(56) References Cited

U.S. PATENT DOCUMENTS

| | | | | |
|---|---|---|---|---|
| 4,922,324 A | * | 5/1990 | Sudo ........................... | 257/700 |
| 5,285,352 A | * | 2/1994 | Pastore et al. ............... | 361/707 |
| 5,371,321 A | * | 12/1994 | Hamzehdoost et al. ....... | 29/832 |
| 5,567,654 A | * | 10/1996 | Beilstein, Jr. et al. ...... | 438/109 |
| 5,712,767 A | * | 1/1998 | Koizumi ...................... | 361/761 |
| 5,831,833 A | * | 11/1998 | Shirakawa et al. ......... | 361/762 |
| 5,835,357 A | * | 11/1998 | Swamy et al. ............... | 361/764 |
| 5,963,429 A | * | 10/1999 | Chen ........................... | 361/764 |
| 6,043,987 A | * | 3/2000 | Goodwin et al. ........... | 361/763 |
| 6,107,683 A | * | 8/2000 | Castro et al. ................ | 257/700 |
| 6,333,856 B1 | * | 12/2001 | Harju .......................... | 361/761 |

* cited by examiner

*Primary Examiner*—David L. Talbott
*Assistant Examiner*—John B. Vigushin
(74) *Attorney, Agent, or Firm*—Hunton & Williams

(57) ABSTRACT

A technique for increasing electronic component density on multilayer printed circuit boards is disclosed. In one embodiment, the technique is realized as an improved multilayer circuit board for enabling the stacking of electronic components. The multilayer circuit board has a first electrically conductive layer and a second electrically conductive layer separated by at least one dielectric layer. The improvement comprises a cavity in the multilayer circuit board extending through the first electrically conductive layer and the at least one dielectric layer so as to expose at least a portion of the second electrically conductive layer within the cavity. The cavity is sized to accommodate a first electronic component therein such that the first electronic component makes electrical contact with the exposed portion of the second electrically conductive layer and a second electronic component, which is stacked over the first electronic component, makes electrical contact with the first electrically conductive layer.

19 Claims, 2 Drawing Sheets

MULTILAYER CIRCUIT BOARD

FIELD OF THE INVENTION

The present invention relates generally to multilayer circuit boards and, more particularly, to an improved multilayer circuit board for enabling the stacking of electronic components.

BACKGROUND OF THE INVENTION

Computer systems are increasingly used to perform more and more functions. As a result of this increase in functionality, the number of electronic components that are used within these computer systems correspondingly increases. Typically, such electronic components are mounted on a circuit board, which is then placed into a computer cabinet or chassis so as to allow the circuit board, and the electronic components mounted thereon, to interface with other circuit boards and electronic components. However, there is only a limited amount of space within a computer cabinet or chassis for accommodating circuit boards, and hence the electronic components mounted thereon. Thus, a need has arisen for developing schemes for increasing the density of electronic components on circuit boards.

Perhaps the first scheme that was developed for increasing the density of electronic components on circuit boards was the use of multilayer printed circuit boards. Such multilayer printed circuit boards allow more electrical signals to be routed between electronic components than what was previously possible using only single layer printed circuit boards. It follows that the density of electronic components is typically greater on a multilayer printed circuit board than on a single layer printed circuit board due to the increased number of electrical signals that may be routed between electronic components mounted on a multilayer printed circuit board.

While the use of multilayer printed circuit boards has allowed an increase in electronic component density, this increase in electronic component density has heretofore been limited by the amount of board surface area. That is, there is only a limited amount of surface area upon which electronic components may be mounted on a printed circuit board. With computer system functionality requirements, and hence electronic component requirements, only continuing to increase, there is a need to further increase electronic component density on multilayer printed circuit boards.

In view of the foregoing, it would be desirable to provide a technique for increasing electronic component density on multilayer printed circuit boards.

SUMMARY OF THE INVENTION

According to the present invention, a technique for increasing electronic component density on multilayer printed circuit boards is provided. In a preferred embodiment, the technique is realized as an improved multilayer circuit board for enabling the stacking of electronic components. The multilayer circuit board has a first electrically conductive layer and a second electrically conductive layer separated by at least one dielectric layer. The second electrically conductive layer is disposed beneath the first electrically conductive layer and the at least one dielectric layer within the multilayer circuit board. The improvement comprises a cavity in the multilayer circuit board extending through the first electrically conductive layer and the at least one dielectric layer so as to expose at least a portion of the second electrically conductive layer within the cavity. The cavity is sized to accommodate a first electronic component therein such that the first electronic component makes electrical contact with the exposed portion of the second electrically conductive layer and a second electronic component, which is stacked over the first electronic component, makes electrical contact with the first electrically conductive layer.

The first electronic component and the second electronic component are typically either an integrated circuit component or a discrete component. However, the first electronic component and the second electronic component may also be an electrically conductive shield. For example, the second electronic component may be an electrically conductive shield for shielding electromagnetic interference to and from the first electronic component.

The first electrically conductive layer and the second electrically conductive layer are typically electrically conductive signal layers. However, the first electrically conductive layer and the second electrically conductive layer may also be power/ground plane layers or combination electrically conductive signal and power/ground layers. For example, the second electrically conductive layer may be a power/ground layer having signal contacts formed thereon.

In accordance with other aspects of the present invention, at least the lateral dimensions of the cavity are sized to directly coincide with at least the lateral dimensions of the first electronic component. This alleviates the need for any specialized positioning equipment, which has heretofore typically been required when mounting electronic components on circuit boards.

In accordance with further aspects of the present invention, the cavity is beneficially formed as a channel through which air may be forced for cooling at least the first electronic component.

In accordance with still further aspects of the present invention, wherein the cavity is a first cavity, wherein the at least one dielectric layer is at least one first dielectric layer, wherein the multilayer circuit board has a third electrically conductive layer disposed beneath the second electrically conductive layer within the multilayer circuit board, and wherein the third electrically conductive layer is separated from the second electrically conductive layer by at least one second dielectric layer, the improvement further beneficially comprises a second cavity in the multilayer circuit board extending through the second electrically conductive layer and the at least one second dielectric layer so as to expose at least a portion of the third electrically conductive layer within the second cavity. Similar to above, the second cavity is preferably sized to accommodate a third electronic component therein such that the third electronic component makes electrical contact with the exposed portion of the third electrically conductive layer and the first electronic component is stacked over the third electronic component. In this case, the second cavity is preferably sized so as to be smaller in lateral dimension than the first cavity.

In accordance with still further aspects of the present invention, wherein the multilayer circuit board is a double-sided multilayer circuit board, wherein the cavity is a first cavity on a first side of the multilayer circuit board, wherein the at least one dielectric layer is at least one first dielectric layer, wherein the multilayer circuit board has a third electrically conductive layer and a fourth electrically conductive layer separated by at least one second dielectric layer, and wherein the fourth electrically conductive layer is disposed beneath the third electrically conductive layer and the at least one second dielectric layer relative to a second side of the multilayer circuit board, the improvement further beneficially comprises a second cavity on a second side of the multilayer circuit board extending through the third electrically conductive layer and the at least one second dielectric layer so as to expose at least a portion of the fourth electrically conductive layer within the second cavity. Similar to above, the second cavity is sized to accommodate a third electronic component therein such that the third electronic component makes electrical contact with the exposed portion of the fourth electrically conductive layer and a fourth electronic component, which is stacked over the third electronic component, makes electrical contact with the third electrically conductive layer. Significantly, the second cavity can be located substantially opposite the first cavity in the multilayer circuit board.

In an alternative embodiment, the technique is realized as a method for increasing electronic component density on a multilayer circuit board. The multilayer circuit board has a first electrically conductive layer and a second electrically conductive layer separated by at least one dielectric layer, and the second electrically conductive layer is disposed beneath the first electrically conductive layer and the at least one dielectric layer within the multilayer circuit board. The method comprises forming a cavity in the multilayer circuit board extending through the first electrically conductive layer and the at least one dielectric layer so as to expose at least a portion of the second electrically conductive layer within the cavity. The cavity is sized to accommodate a first electronic component therein such that the first electronic component makes electrical contact with the exposed portion of the second electrically conductive layer and a second electronic component, which is stacked over the first electronic component, makes electrical contact with the first electrically conductive layer.

In accordance with other aspects of the present invention, the cavity may be formed by etching the cavity in the multilayer circuit board. For example, the cavity may be formed by photolithographically etching the cavity in the multilayer circuit board, or plasma etching the cavity in the multilayer circuit board. Alternatively, the cavity may be formed by milling the cavity in the multilayer circuit board. For example, the cavity may be formed by laser abating the cavity in the multilayer circuit board. Alternatively still, the cavity may be formed by prefabricating the first electrically conductive layer and/or the at least one dielectric layer such that the cavity is formed upon assembly of the first electrically conductive layer and the at least one dielectric layer into the multilayer circuit board.

In accordance with further aspects of the present invention, wherein the cavity is a first cavity, wherein the at least one dielectric layer is at least one first dielectric layer, wherein the multilayer circuit board has a third electrically conductive layer disposed beneath the second electrically conductive layer within the multilayer circuit board, and wherein the third electrically conductive layer is separated from the second electrically conductive layer by at least one second dielectric layer, the method further beneficially comprises forming a second cavity in the multilayer circuit board extending through the second electrically conductive layer and the at least one second dielectric layer so as to expose at least a portion of the third electrically conductive layer within the second cavity. Similar to above, the second cavity is sized to accommodate a third electronic component therein such that the third electronic component makes electrical contact with the exposed portion of the third electrically conductive layer and the first electronic component is stacked over the third electronic component.

In accordance with further aspects of the present invention, wherein the multilayer circuit board is a double-sided multilayer circuit board, wherein the cavity is a first cavity on a first side of the multilayer circuit board, wherein the at least one dielectric layer is at least one first dielectric layer, wherein the multilayer circuit board has a third electrically conductive layer and a fourth electrically conductive layer separated by at least one second dielectric layer, and wherein the fourth electrically conductive layer is disposed beneath the third electrically conductive layer and the at least one second dielectric layer relative to a second side of the multilayer circuit board, the method further beneficially comprises forming a second cavity on a second side of the multilayer circuit board extending through the third electrically conductive layer and the at least one second dielectric layer so as to expose at least a portion of the fourth electrically conductive layer within the second cavity. Similar to above, the second cavity is sized to accommodate a third electronic component therein such that the third electronic component makes electrical contact with the exposed portion of the fourth electrically conductive layer and a fourth electronic component, which is stacked over the third electronic component, makes electrical contact with the third electrically conductive layer.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
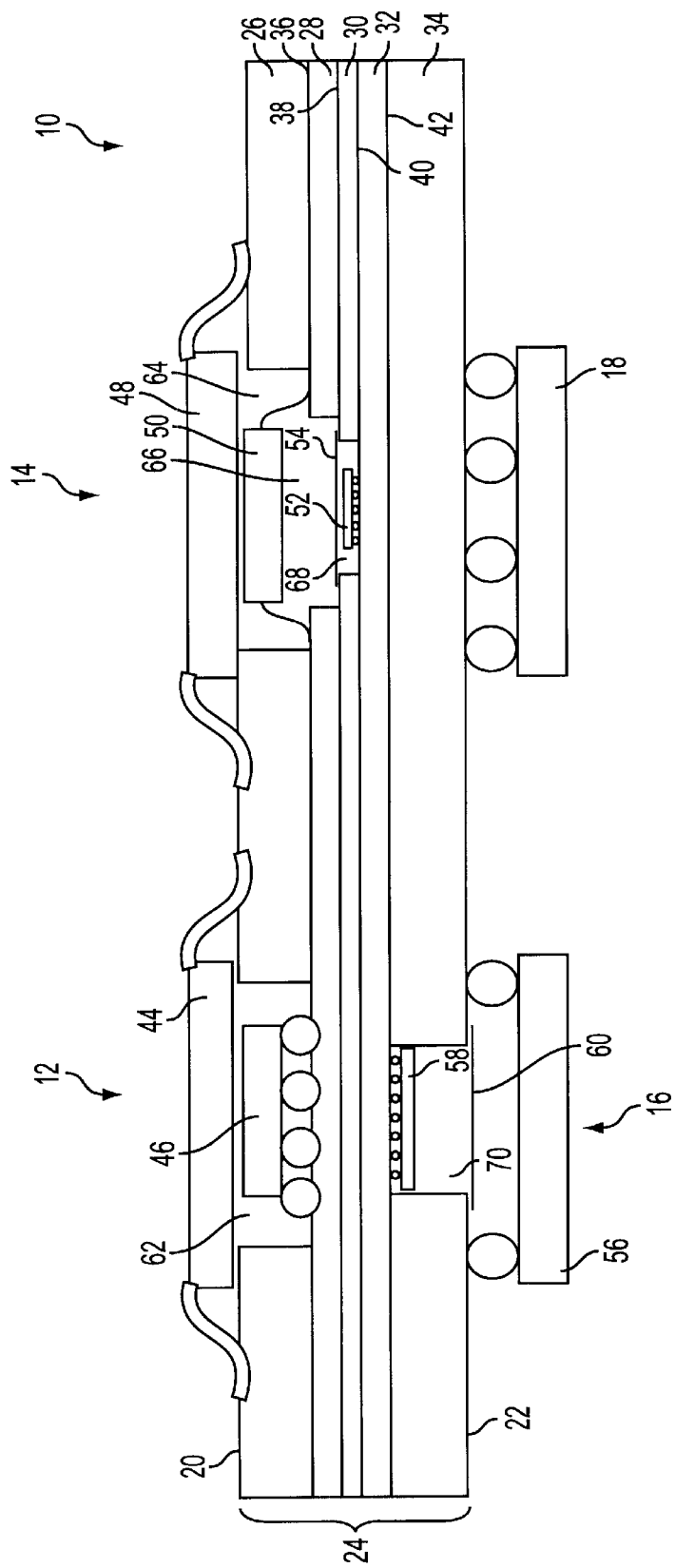
FIG. 1 is a side cross-sectional view of a double-sided multilayer printed circuit board having groups of stacked electronic components in accordance with the present invention.

Referring to FIG. 1, there is shown a side cross-sectional view of a double-sided multilayer printed circuit board 10 having groups of stacked electronic components 12, 14, and 16 in accordance with the present invention. The double-sided multilayer printed circuit board 10 also has a non-stacked electronic component 18 for comparison purposes and for assisting in understanding the concepts and benefits of the present invention.

The multilayer printed circuit board 10 comprises a primary (top) layer 20, a secondary (bottom) layer 22, and a plurality of intermediate layers 24. The top layer and the bottom layer 22 are typically electrically conductive power/ground plane layers, but also have electrically conductive contact pads to which electronic components may be electrically connected, as described in detail below. The intermediate layers 24 alternate between non-electrically conductive dielectric layers and either electrically conductive signal layers or electrically conductive power/ground plane layers. For example, in FIG. 1, layers 26, 28, 30, 32, and 34 are non-electrically conductive dielectric layers, layers 36, 40, and 42 are electrically conductive signal layers, and layer 38 (as well as layers 20 and 22) is an electrically conductive power/ground plane layer.

The first group of stacked electronic components 12 comprises a first electronic component 44 having a gull wing leaded package and a second electronic component 46 having a full ball grid array package. The gull wing leads of the first electronic component 44 are electrically connected to electrically conductive contact pads formed on the top layer 20 that are separate from an otherwise present electrically conductive power/ground plane. Beneath the first electronic component 44, a cavity 62 is formed in the multilayer printed circuit board 10 extending through the top layer 20 and the nonelectrically conductive dielectric layer 26 so as to expose at least a portion of the electrically conductive signal layer 36. The portion of the electrically conductive signal layer 36 that is exposed by the cavity 62 has electrically conductive contact pads formed thereon. The ball grid array contacts of the second electronic component 46 are electrically connected to the electrically conductive contact pads formed on the electrically conductive signal layer 36. That is, the cavity 62 is sized so as to allow the second electronic component 46 to be mounted therein and thereby allow the ball grid array contacts of the second electronic component 46 to be electrically connected to the electrically conductive contact pads formed on the electrically conductive signal layer 36.

The second group of stacked electronic components 14 comprises a third electronic component 48 having a gull wing leaded package, a fourth electronic component 50 having a gull wing leaded package, a fifth electronic component 52 having a full ball grid array package, and an electrically conductive shielding plate 54, which will be described in detail below. The gull wing leads of the third electronic component 48 are electrically connected to electrically conductive contact pads formed on the top layer 20 that are separate from an otherwise present electrically conductive power/ground plane. Beneath the third electronic component 48, there are formed a series of decreasing-sized cavities 64, 66, and 68. The first cavity 64 in the series of cavities is formed in the multilayer printed circuit board 10 extending through the top layer 20 and the non-electrically conductive dielectric layer 26 so as to expose at least a portion of the electrically conductive signal layer 36. The portion of the electrically conductive signal layer 36 that is exposed by the cavity 64 has electrically conductive contact pads formed thereon. The gull wing leads of the fourth electronic component 50 are electrically connected to the electrically conductive contact pads formed on the electrically conductive signal layer 36. That is, the cavity 64 is sized so as to allow the fourth electronic component 50 to be mounted therein and thereby allow the gull wing leads of the fourth electronic component 50 to be electrically connected to the electrically conductive contact pads formed on the electrically conductive signal layer 36.

The second cavity 66 in the series of cavities is formed in the multilayer printed circuit board 10 extending through the electrically conductive signal layer 36 and the non-electrically conductive dielectric layer 28 so as to expose at least a portion of the electrically conductive power/ground plane layer 38. The electrically conductive shielding plate 54 is electrically connected to the portion of the electrically conducting power/ground plane layer 38 that is exposed by the cavity 66, thereby providing a shield for any electromagnetic interference (EMI) which may be emanating from the fifth electronic component 52 or against any EMI to which the fifth electronic component 52 may be susceptible.

The third cavity 68 in the series of cavities is formed in the multilayer printed circuit board 10 extending through the electrically conductive power/ground plane layer 38 and the non-electrically conductive dielectric layer 30 so as to expose at least a portion of the electrically conductive signal layer 40. The portion of the electrically conductive signal layer 40 that is exposed by the cavity 68 has electrically conductive contact pads formed thereon. The ball grid array contacts of the fifth electronic component 52 are electrically connected to the electrically conductive contact pads formed on the electrically conductive signal layer 40. That is, the cavity 68 is sized so as to allow the fifth electronic component 52 to be mounted therein and thereby allow the ball grid array contacts of the fifth electronic component 52 to be electrically connected to the electrically conductive contact pads formed on the electrically conductive signal layer 40.

The third group of stacked electronic components 16 comprises a sixth electronic component 56 having a peripheral ball grid array package, a seventh electronic component 58 having a full ball grid array package, and an electrically conductive shielding plate 60, which will be described in detail below. The ball grid array contacts of the sixth electronic component 56 are electrically connected to electrically conductive contact pads formed on the bottom layer 22 that are separate from an otherwise present electrically conductive power/ground plane. Beneath the sixth electronic component 56, a cavity 70 is formed in the multilayer printed circuit board 10 extending through the bottom layer 22 and the non-electrically conductive dielectric layer 34 so as to expose at least a portion of the electrically conductive signal layer 42. The portion of the electrically conductive signal layer 42 that is exposed by the cavity 70 has electrically conductive contact pads formed thereon. The ball grid array contacts of the seventh electronic component 58 are electrically connected to the electrically conductive contact pads formed on the electrically conductive signal layer 42. That is, the cavity 70 is sized so as to allow the seventh electronic component 58 to be mounted therein and thereby allow the ball grid array contacts of the seventh electronic component 58 to be electrically connected to the electrically conductive contact pads formed on the electrically conductive signal layer 42.

At this point it should be noted that, as can be seen from FIG. 1, the sizing relationship between the cavity 70 and the seventh electronic component 58 is such that the cavity 70 is precisely sized to coincide with the outer dimensions of the seventh electronic component 58. This precise sizing of the cavity 70 allows the seventh electronic component 58 to be positioned within the cavity 70 without the need for any specialized positioning equipment, which has heretofore typically been required when mounting electronic components on printed circuit boards.

Similar to the electrically conductive shielding plate 54, the electrically conductive shielding plate 60 is electrically connected to the electrically conducting power/ground plane formed on the bottom layer 22. As with the electrically conductive shielding plate 54, the electrically conductive shielding plate 60 provides a shield for any electromagnetic interference (EMI) which may be emanating from the seventh electronic component 58 or against any EMI to which the seventh electronic component 58 may be susceptible.

At this point it should be noted that, as can be seen from FIG. 1, cavities can be formed in both sides of the double-sided multilayer printed circuit board 10 with no detrimental effects to the structure of the double-sided multilayer printed circuit board 10. That is, as long as one or more layers are still present between an upper cavity (e.g., cavity 62) and a lower cavity (e.g., cavity 70), there should be no detrimental effects to the structure of the double-sided multilayer printed circuit board 10. In fact, regardless of whether there is an opposing cavity formed in the double-sided multilayer printed circuit board 10 (e.g., a cavity opposing the decreasing-sized cavities 64, 66, and 68), there should be no detrimental effects to the structure of the double-sided multilayer printed circuit board 10. However, even if structural integrity is a concern, most, if not all, printed circuit boards in use today use board edge stiffeners to provide additional structural support and prevent against warpage.

Figure 2:
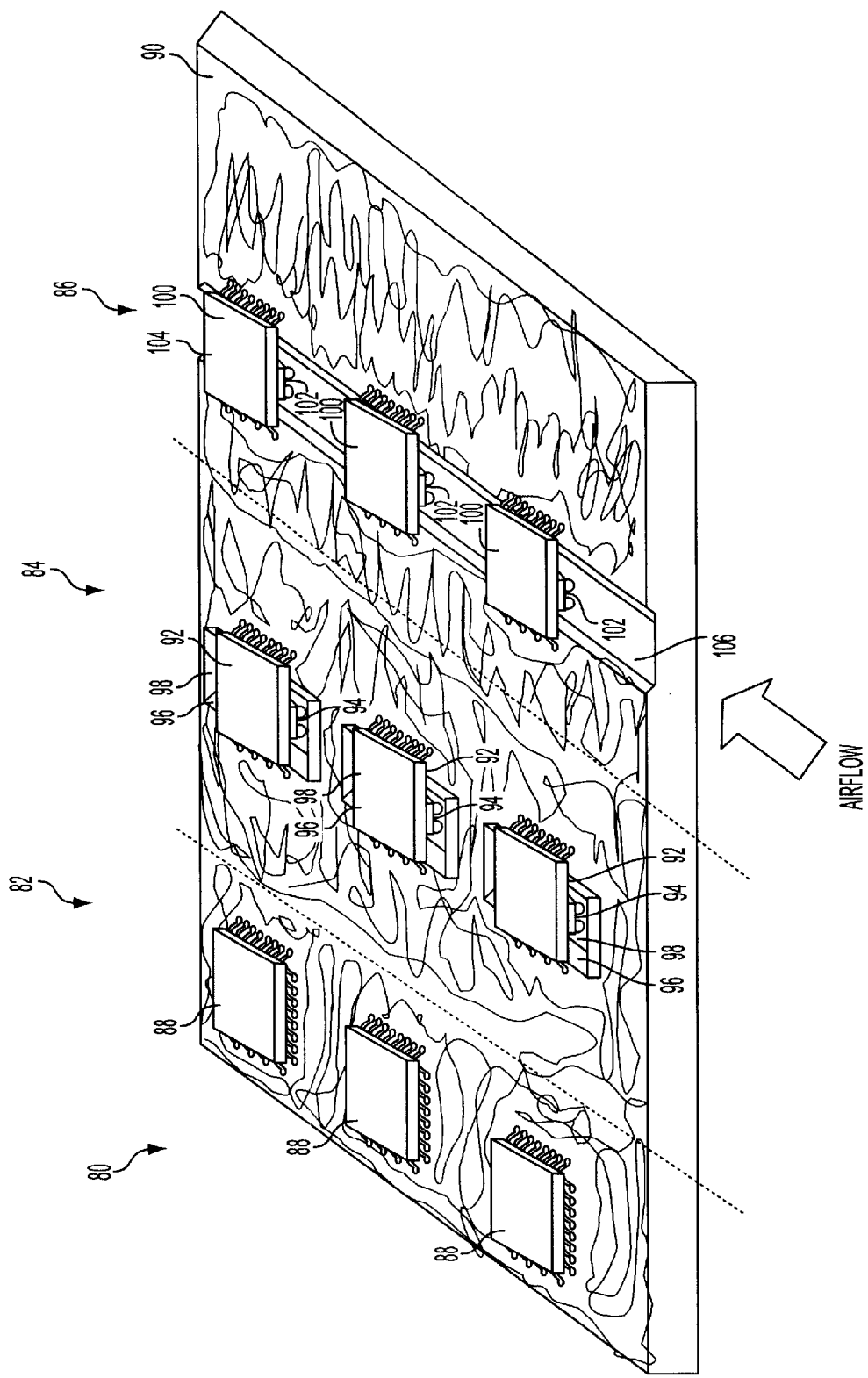
FIG. 2 is a perspective cross-sectional view of a double-sided multilayer printed circuit board having three types of groups of stacked electronic components in accordance with the present invention.

Referring to FIG. 2, there is shown a perspective cross-sectional view of a double-sided multilayer printed circuit board 80 having a first type 82 of groups of stacked electronic components, a second type 84 of groups of stacked electronic components, and a third type 86 of groups of stacked electronic components in accordance with the present invention.

Each of the first type 82 of groups of stacked electronic components comprises an upper electronic component 88 mounted on the top layer 90 of the double-sided multilayer printed circuit board 80, and at least one lower electronic component (not shown, covered by upper electronic component 88) mounted within at least one respective cavity (not shown, covered by upper electronic component 88) formed within the double-sided multilayer printed circuit board 80 on an exposed portion of at least one respective electrically conductive signal layer (not shown, covered by upper electronic component 88). This first type 82 of component stacking arrangement is preferred for low power electronic components, which do not generate large amounts of heat and can therefore be cooled by conduction through contact with the double-sided multilayer printed circuit board 80. It should be noted that in this first type 82 of groups of stacked electronic components, the upper electronic component 88 has leads on all four sides thereof.

Each of the second type 84 of groups of stacked electronic components comprises an upper electronic component 92 mounted on the top layer 90 of the double-sided multilayer printed circuit board 80, and at least one lower electronic component 94 (only one shown) mounted within at least one respective cavity 96 (only one shown) formed within the double-sided multilayer printed circuit board 80 on an exposed portion of at least one respective electrically conductive signal layer 98 (only one shown). This second type 84 of component stacking arrangement is preferred for medium power electronic components, which generate a medium amount of heat and can therefore be cooled by a combination of conduction through contact with the double-sided multilayer printed circuit board 80 and convection through contact with air flowing naturally over each electronic component.

Each of the third type 86 of groups of stacked electronic components comprises an upper electronic component 100 mounted on the top layer 90 of the double-sided multilayer printed circuit board 80, and at least one lower electronic component 102 (only one shown) mounted within at least one respective channel 104 (only one shown) formed within the double-sided multilayer printed circuit board 80 on an exposed portion of at least one respective electrically conductive signal layer 106 (only one shown). This third type 86 of component stacking arrangement is preferred for high power electronic components, which generate a high amount of heat and must therefore be cooled by a combination of conduction through contact with the double-sided multilayer printed circuit board 80 and forced air cooling through contact with air being forced down the channel 104, as shown in FIG. 2.

At this point it should be noted that each of the above-described three types 82, 84, and 86 of groups of stacked electronic components may be used interchangeably with each other depending upon thermal requirements. Also, although not shown in FIG. 2, each of the above-described three types 82, 84, and 86 of groups of stacked electronic components may be used with each other on either side of the double-sided multilayer printed circuit board 80.

It should also be noted that although the above-described embodiments have been described with the electronic components having gull wing leaded packages or ball grid array packages, the present invention is not limited in this regard. For example, electronic components having dual-in-line packages (DIP), pin grid array (PGA) packages, and leadless chip carrier packages, to name a few, can also be stacked in accordance with the practices of the present invention. Also, in addition to integrated circuit components, discrete electronic components may also be stacked in accordance with the practices of the present invention.

It should further be noted that the above-described cavities and/or channels can be formed using several different types of fabrication methods. For example, photolithographic or plasma-based etching can be used to form cavities and/or channels in a resin or epoxy-based multilayer printed circuit board in accordance with the present invention. Alternatively, if a multilayer printed circuit board is glass reinforced (and thereby not easily etchable by conventional etching techniques), precision milling by laser ablation using a $CO_2$ laser, or other milling techniques or non-conventional etching techniques, can be used to form cavities and/or channels in a multilayer printed circuit board in accordance with the present invention. Alternatively still, the dielectric layers and/or the electrically conductive layers may be prefabricated such that the cavities/channels are formed upon assembly of the dielectric layers and the electrically conductive layers into the multilayer circuit board in accordance with the present invention.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. An improved multilayer circuit board for enabling the stacking of electronic components, the multilayer circuit board having a first electrically conductive layer and a second electrically conductive layer separated by at least one dielectric layer, wherein the second electrically conductive layer is disposed beneath the first electrically conductive layer and the at least one dielectric layer within the multilayer circuit board, the improvement comprising:

a cavity in the multilayer circuit board extending through the first electrically conductive layer and the at least one dielectric layer so as to expose at least a portion of the second electrically conductive layer within the cavity, wherein the cavity is sized to accommodate a first electronic component therein such that the first electronic component makes electrical contact with the exposed portion of the second electrically conductive layer and a second electronic component, which is stacked over the first electronic component, makes electrical contact with the first electrically conductive layer, wherein at least the lateral dimensions of the cavity are sized to directly coincide with at least the lateral dimensions of the first electronic component.

2. The improved multilayer circuit board as defined in claim 1, wherein the first electronic component is one of an integrated circuit component and a discrete component.

3. The improved multilayer circuit board as defined in claim 1, wherein the second electronic component is an electrically conductive shield for shielding electromagnetic interference to and from the first electronic component.

4. The improved multilayer circuit board as defined in claim 1, wherein the first electrically conductive layer is an electrically conductive signal layer.

5. The improved multilayer circuit board as defined in claim 1, wherein the second electrically conductive layer is one of an electrically conductive signal layer and an electrically conductive power/ground plane layer.

6. The improved multilayer circuit board as defined in claim 1, wherein the cavity is a channel through which air may be forced for cooling at least the first electronic component.

7. The improved multilayer circuit board as defined in claim 1, wherein the cavity is a first cavity, wherein the at least one dielectric layer is at least one first dielectric layer, wherein the multilayer circuit board has a third electrically conductive layer disposed beneath the second electrically conductive layer within the multilayer circuit board, and wherein the third electrically conductive layer is separated from the second electrically conductive layer by at least one second dielectric layer, the improvement further comprising:

a second cavity in the multilayer circuit board extending through the second electrically conductive layer and the at least one second dielectric layer so as to expose at least a portion of the third electrically conductive layer within the second cavity, wherein the second cavity is sized to accommodate a third electronic component therein such that the third electronic component makes electrical contact with the exposed portion of the third electrically conductive layer and the first electronic component is stacked over the third electronic component.

8. The improved multilayer circuit board as defined in claim 7, wherein the second cavity is sized so as to be smaller in lateral dimension than the first cavity.

9. The improved multilayer circuit board as defined in claim 1, wherein the multilayer circuit board is a double-sided multilayer circuit board, wherein the cavity is a first cavity on a first side of the multilayer circuit board, wherein the at least one dielectric layer is at least one first dielectric layer, wherein the multilayer circuit board has a third electrically conductive layer and a fourth electrically conductive layer separated by at least one second dielectric layer, and wherein the fourth electrically conductive layer is disposed beneath the third electrically conductive layer and the at least one second dielectric layer relative to a second side of the multilayer circuit board, the improvement further comprising:

a second cavity on the second side of the multilayer circuit board extending through the third electrically conductive layer and the at least one second dielectric layer so as to expose at least a portion of the fourth electrically conductive layer within the second cavity, wherein the second cavity is sized to accommodate a third electronic component therein such that the third electronic component makes electrical contact with the exposed portion of the fourth electrically conductive layer and a fourth electronic component, which is stacked over the third electronic component, makes electrical contact with the third electrically conductive layer.

10. The improved multilayer circuit board as defined in claim 9, wherein the second cavity is located substantially opposite the first cavity in the multilayer circuit board.

11. A method for increasing electronic component density on a multilayer circuit board, the multilayer circuit board having a first electrically conductive layer and a second electrically conductive layer separated by at least one dielectric layer, wherein the second electrically conductive layer is disposed beneath the first electrically conductive layer and the at least one dielectric layer within the multilayer circuit board, the method comprising the step of:

forming a cavity in the multilayer circuit board extending through the first electrically conductive layer and the at least one dielectric layer so as to expose at least a portion of the second electrically conductive layer within the cavity, wherein the cavity is sized to accommodate a first electronic component therein such that the first electronic component makes electrical contact with the exposed portion of the second electrically conductive layer and a second electronic component, which is stacked over the first electronic component, makes electrical contact with the first electrically conductive layer, wherein at least the lateral dimensions of the cavity are sized to directly coincide with at least the lateral dimensions of the first electronic component.

12. The method as defined in claim 11, wherein the step of forming a cavity comprises the step of:

etching the cavity in the multilayer circuit board.

13. The method as defined in claim 12, wherein the step of etching the cavity includes photolithographically etching the cavity in the multilayer circuit board.

14. The method as defined in claim 12, wherein the step of etching the cavity includes plasma etching the cavity in the multilayer circuit board.

15. The method as defined in claim 11, wherein the step of forming a cavity comprises the step of:

milling the cavity in the multilayer circuit board.

16. The method as defined in claim 15, wherein the step of milling the cavity includes laser abating the cavity in the multilayer circuit board.

17. The method as defined in claim 11, wherein the step of forming a cavity comprises the step of:

prefabricating at least one of the first electrically conductive layer and the at least one dielectric layer such that the cavity is formed upon assembly of the first electrically conductive layer and the at least one dielectric layer in the multilayer circuit board.

18. The method as defined in claim 11, wherein the cavity is a first cavity, wherein the at least one dielectric layer is at least one first dielectric layer, wherein the multilayer circuit board has a third electrically conductive layer disposed beneath the second electrically conductive layer within the multilayer circuit board, and wherein the third electrically conductive layer is separated from the second electrically conductive layer by at least one second dielectric layer, further comprising the step of:

forming a second cavity in the multilayer circuit board extending through the second electrically conductive layer and the at least one second dielectric layer so as to expose at least a portion of the third electrically conductive layer within the second cavity, wherein the second cavity is sized to accommodate a third electronic component therein such that the third electronic component makes electrical contact with the exposed portion of the third electrically conductive layer and the first electronic component is stacked over the third electronic component.

19. The method as defined in claim 11, wherein the multilayer circuit board is a double-sided multilayer circuit board, wherein the cavity is a first cavity on a first side of the multilayer circuit board, wherein the at least one dielectric layer is at least one first dielectric layer, wherein the multilayer circuit board has a third electrically conductive layer and a fourth electrically conductive layer separated by at least one second dielectric layer, and wherein the fourth electrically conductive layer is disposed beneath the third electrically conductive layer and the at least one second dielectric layer relative to a second side of the multilayer circuit board, further comprising the step of:

forming a second cavity on a second side of the multilayer circuit board extending through the third electrically conductive layer and the at least one second dielectric layer so as to expose at least a portion of the fourth electrically conductive layer within the second cavity, wherein the second cavity is sized to accommodate a third electronic component therein such that the third electronic component makes electrical contact with the exposed portion of the fourth electrically conductive layer and a fourth electronic component, which is stacked over the third electronic component, makes electrical contact with the third electrically conductive layer.

* * * * *